(12) United States Patent
Morizuka et al.

(10) Patent No.: US 6,344,775 B1
(45) Date of Patent: Feb. 5, 2002

(54) SEMICONDUCTOR DEVICE

(75) Inventors: Kouhei Morizuka; Yasuhiko Kuriyama, both of Kanagawa-ken (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/531,227

(22) Filed: Mar. 20, 2000

(30) Foreign Application Priority Data

Mar. 18, 1999 (JP) ............................................ 11-073279
Sep. 30, 1999 (JP) ............................................ 11-280672

(51) Int. Cl.$^7$ ................................................ H03F 3/14
(52) U.S. Cl. ........................ 330/288; 330/289; 330/307
(58) Field of Search ................................ 330/288, 289, 330/307

(56) References Cited

U.S. PATENT DOCUMENTS 4,389,619 A  *  6/1983  Limberg ..................... 330/288
4,604,586 A  *  8/1986  Rinderle ..................... 330/288

OTHER PUBLICATIONS

Burhan Bayraktaroglu et al., "Very High–Power–Density CW Operation of GaAs/AlGaAs Microwave Heterojunction Bipolar Transistors", IEEE Electron Device Letters, vol. 14, No. 10, (Oct. 1993), pp. 493–495.*

* cited by examiner

Primary Examiner—Steven J. Mottola
(74) Attorney, Agent, or Firm—Oblon, Spivak, McClelland, Maier & Neustadt, P.C.

(57) ABSTRACT

A semiconductor device is provided having a high-frequency amplifying bipolar transistor (10) with its emitter electrode grounded. A current mirror circuit including a bipolar transistor (20) supplies the transistor (10) with a base potential as bias voltages for operating as a Class B or Class AB amplifier. A thermal linkage is established between the transistor (10) and the transistor (20) to reduce a difference between their junction temperatures. A metallic layer (4) is provided as a means for establishing the thermal linkage. The transistor (20) is provided between fingers (1A) and (1B) of the transistor (10) as another means for establishing the thermal linkage. A distance between the transistor (20) and one of the fingers (1A) and (1B) of the transistor (10) is made smaller than the thickness of a semiconductor substrate (7) on which the transistors are formed as other means for establishing the thermal linkage.

14 Claims, 12 Drawing Sheets

FIG. 1
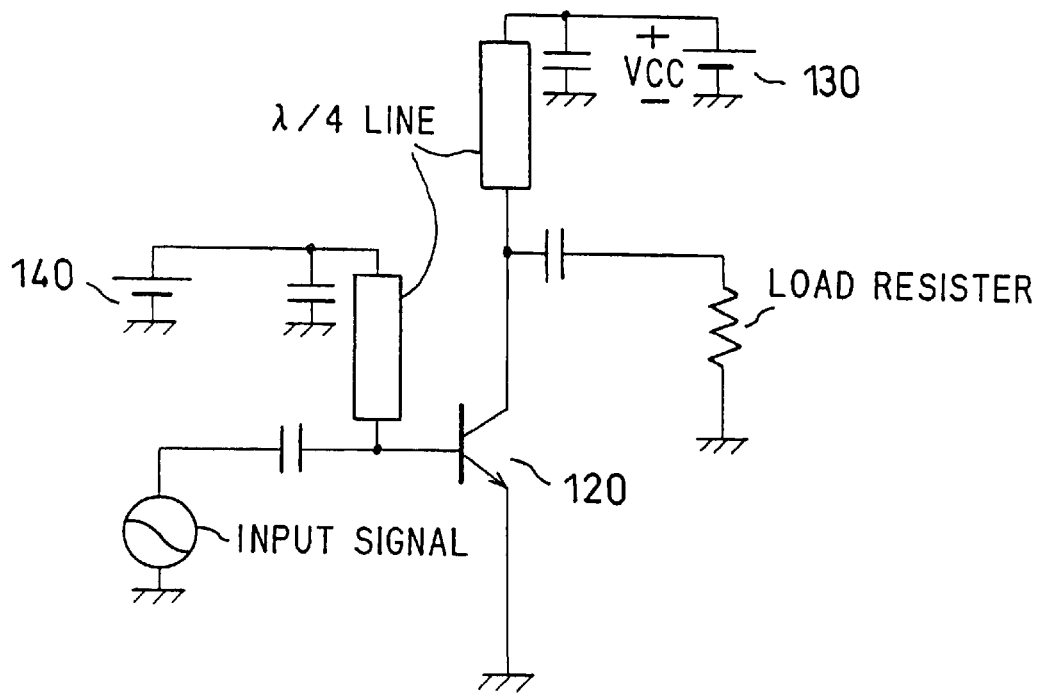
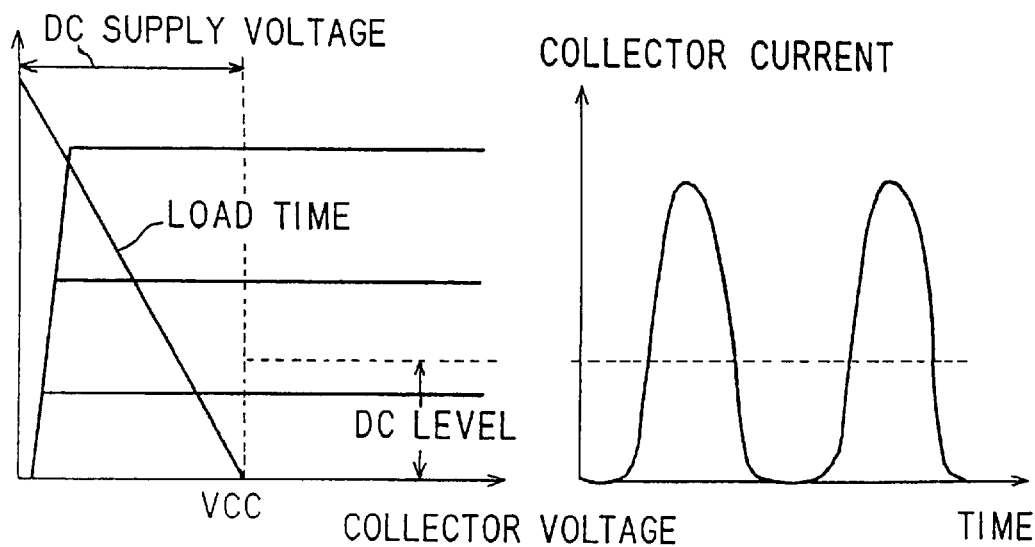
FIG. 2(a)    FIG. 2(b)

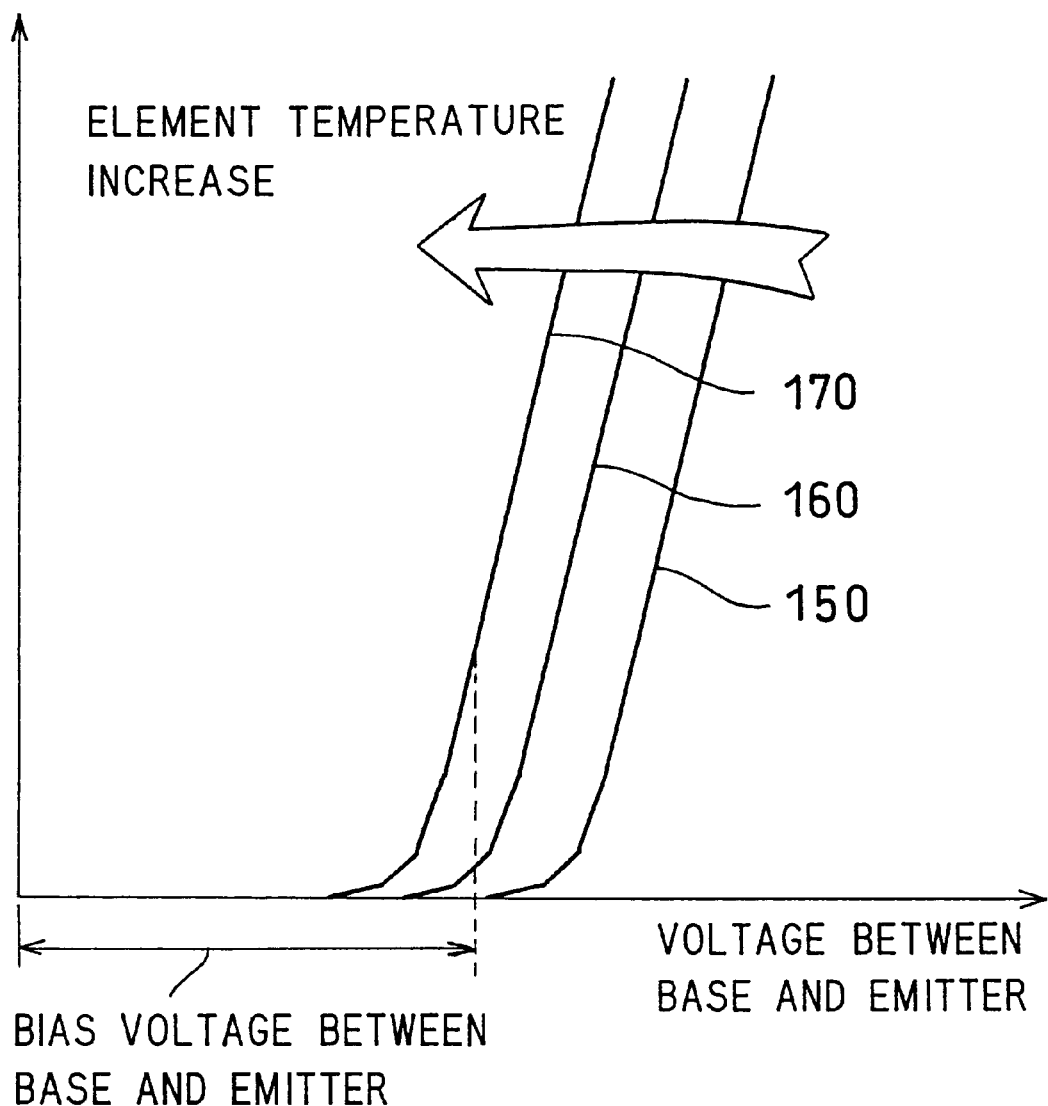

SEMICONDUCTOR DEVICE

BACKGROUND OF THE INVENTION

The present invention relates to a semiconductor high frequency power amplifier and more particularly to a bipolar transistor high-frequency power amplifier having high efficiency and excellent linearity.

With rapid widespread of portable radio terminals, a linear modulation is adopted as a recent standard of communication terminals to improve efficient use of radio waves and to satisfy needs for high-speed data communication. In the linear modulation, the magnitude of transmission power varies with a signal. Band width of a spectrum of the transmission power spreads wider than that of an input power if a power amplifier has a non-linear amplification characteristic. This wide spectrum interferes with a signal in the channel existing in an adjacent frequency band. A strict restriction is thus imposed to control the spreading of the spectrum within a certain threshold value. Therefore, it is essential that power amplifiers used for recent portable radio terminals must be sufficiently linear.

Generally, a bias point of a power amplifier transistor is so set as to operate as a Class B or Class AB amplifier to ensure linear amplification. However, a power efficiency of the Class A amplifier is as low as 50% at maximum in the theoretical limit and the efficiency of an actual amplifier is generally only about 30% at maximum. Since the power efficiency of a power amplifier is a great factor for deciding the battery life in a portable terminal, the efficiency of the Class A amplifier is not sufficient. Among the non-linear distortions, only the odd-degree distortion affects frequencies around an input signal band, so that the even-degree distortions are permitted. From such a viewpoint, a Class B amplifier is now adopted as a circuit which is more efficient than a Class A amplifier and satisfies the distortion standard required for the portable terminal. In an actual portable terminal, however, the distortion produced by the power amplifier in which a theoretical Class B bias point is set, is likely to increase when the input signal level is small. Therefore, the bias point is often set at a point called as the Class AB which is an intermediate point of the Class A and the Class B. Hereinafter, for simplicity of discussion, the problems of the prior arts will be explained using an example of a Class B amplifier.

Firstly, a bipolar transistor amplifier as shown in FIG. 1 will be considered. A collector output characteristic curve of a bipolar transistor 120 and a load line are shown in FIG. 2. As shown in FIG. 2(b), an output current of the Class B amplifier shows a waveform rectified in a half a wave. With the rectified wave form, no odd-degree distortions are generated. With increases of an output power, however, the rectified half waveform cannot be maintained and odd-degree distortions are generated when an instantaneous collector voltage lowers to the saturation voltage of the transistor. Therefore, the Class B amplifier can be used with a high linearity required for a portable terminal up to the critical point where the instantaneous collector voltage is lowered to the saturation voltage and the collector power efficiency at this time is expressed as follows:

$$\eta = \pi/4 \times (1 - Vsat/Vcc)$$

where Vsat indicates a saturation voltage of the bipolar transistor which is typically about 0.2 V. Assuming Vcc as 3.5 V, the efficiency becomes 74%, which is a higher efficiency than that of a Class A amplifier.

However, the experiment of the inventors shows that the high efficiency and the high linearity are incompatible with each other in an element having particularly large output power. The reason is described below. As shown in FIG. 2(b), the DC current supplied from a collector bias power source (130) to the transistor 120 varies depending on the output power level in the Class B amplifier. Therefore, power consumption of the transistor element, which is very small when there is no input signal, increases as the input signal level increases and the junction temperature of the output-transistor also increases. Input and output characteristic (hereinafter referred to as I/O characteristic) of the bipolar transistor is shown in FIG. 3 using the junction temperature as a parameter. In a bipolar transistor, when the junction temperature rises, the diffusion potential lowers. Accordingly, as shown in FIG. 2, a collector current increases as the temperature of the transistor element rises when a base is biased by a constant voltage source (140). The reason is that the I/O characteristic curve 150 with no temperature rise in the transistor element shifts to a characteristic curve 160 when the junction temperature increases by 20 K. The curve also shifts to a curve 170 when the junction temperature increases by 40 K. Therefore, as shown in FIG. 4, a load line 180 with no temperature rise of the transistor element shifted to a line 190 when the element temperature rises by 20 K and to a line 200 when the element temperature rises by 40 K. With the shifts of the load line, DC input power increases correspondingly, and the power efficiency deteriorates.

FIG. 5 shows a result of an experiment by the inventors and of a theoretical analysis. In the experiment, a heterojunction bipolar transistor (hereinafter referred to as HBT) is used in which a base and a collector are made of GaAs and an emitter is made of InGaP. Also in the experiment, a bias point of Class AB is set. As shown in FIG. 5, the power efficiency at the point (210, 220), where the distortion starts to increase is expected to be as high as 58% when the thermal resistance of the element is 0 K/W. However, the power efficiency of the transistor element having an actual thermal resistance of 30 K/W deteriorated to 45% with decrease of 13%. Since the power consumption of the element at the point 220 is 1.2 W, the element temperature rose by 36 K compared with the temperature at the time when there is no signal input. Since a temperature coefficient of a potential between the base and the emitter of the InGaP/GaAs-HBT is about -1.1, mV/K, a DC voltage between the base and the emitter substantially increased by 40 mV, resulting in an increase in the collector current and in deterioration in the efficiency.

SUMMARY OF THE INVENTION

An object of the present invention is to solve the aforementioned problems of the prior arts and to provide a highly efficient and linear amplifier for suppressing the increase in the collector current caused by the heat generation of the power amplifying transistor element.

Another object of the present invention is to provide a highly efficient and linear transistor amplifier for power amplification, which is biased in a Class B or a Class AB.

Still another object of the present invention is to provide a transistor amplifier for high-frequency power amplification suited to such a small and lightweight communication device as a portable telephone operated by a battery.

According to the present invention, a high-frequency power-amplifying bipolar transistor is provided which is so biased as to operate as the Class B or Class AB amplifier. A current mirror circuit including a bipolar transistor supplies a base potential for the power-amplifying transistor. The transistor included in the current mirror circuit and the power-amplifying transistors are so arranged as to establish a thermal linkage between them and to reduce a difference between their junction temperatures.

According to an embodiment of the present invention, a metallic electrode layer is provided for establishing the thermal linkage.

According to another embodiment of the present invention, the transistor in the current mirror circuit is provided between fingers of the power-amplifying transistor for establishing the thermal linkage.

According to yet another embodiment of the present invention, a distance between the transistor in the current mirror circuit and one of the fingers of the power amplifying transistor is made smaller than the thickness of a semiconductor substrate on which the transistors are formed for establishing the thermal linkage.

More specifically, a semiconductor device according to the present invention has a power amplifying bipolar transistor with a grounded emitter, a current mirror circuit including a bipolar transistor for supplying a base voltage to the transistor, and a thermal linkage structure formed between the power amplifying bipolar transistor and the bipolar transistor included in the current mirror circuit.

In the semiconductor device according to the present invention, the power amplifying bipolar transistor and the bipolar transistors in the current mirror circuit are heterojunction compound semiconductor transistors, which are monolithically integrated on a common semiconductor substrate.

Further, in the semiconductor device according to the present invention, the thermal linkage structure formed between the power amplifying transistor and the transistor in the current mirror circuit comprises an inter-layer insulating film laminated on the power amplifying bipolar transistor and a metallic wire which is laminated on the inter-layer insulating film, which is electrically connected to an emitter electrode of the power amplifying bipolar transistor via a through hole formed in the inter-layer insulating film, and is extended to a neighborhood of the bipolar transistors in the current mirror circuit.

Further, in the semiconductor device according to the present invention, the thermal linkage structure formed between the power amplifying transistor and the transistor in the current mirror circuit comprises an inter-layer insulating film laminated on the power amplifying bipolar transistor and on the bipolar transistors in the current mirror circuit, and a metallic wire which is laminated on the inter-layer insulating film, which electrically connects an emitter electrode of the power amplifying bipolar transistor and an emitter electrode of the bipolar transistor in the current mirror circuit to a ground via through holes formed in the inter-layer insulating film.

Furthermore, in the semiconductor device according to the present invention, the means for establishing a thermal linkage between the power amplifying transistor and the transistor of the current mirror circuit comprises an inter-layer insulating film laminated on the power amplifying bipolar transistor and the bipolar transistor in the current mirror circuit, and a metallic wire which is laminated on the inter-layer insulating film for electrically connecting an emitter electrode of the power amplifying bipolar transistor to a ground via a through hole formed in the inter-layer insulating film at a portion above the power amplifying bipolar transistor. The metallic wire is electrically insulated from the emitter electrodes of the bipolar transistors in the current mirror circuit.

Furthermore, in the semiconductor device according to the present invention, the metallic wire is laminated on the bipolar transistors in the current mirror circuit via another insulating film, which is thinner than the inter-layer insulating film.

Furthermore, in the semiconductor device according to the present invention, the metallic wire is made of a metallic layer of 2 $\mu$m or more in thickness.

Furthermore, in the semiconductor device according to the present invention, the power amplifying bipolar transistor with a grounded emitter is a high-frequency amplification transistor so biased as to operate as a Class B or a Class AB amplifier.

Furthermore, in the semiconductor device of the present invention, the bipolar transistors in the current mirror circuit is formed at an area adjacent to the power amplifying bipolar transistor to thermally link the power amplifying transistor and the transistor of the current mirror circuit.

Furthermore, in the semiconductor device according to the present invention, the power amplifying bipolar transistor is a multi-finger transistor including a plurality of element transistors forming fingers and the bipolar transistor in the current mirror circuit is formed at an area between the fingers of the multi-finger transistor.

Furthermore, in the semiconductor device according to the present invention, the thermal linkage structure between the power amplifying transistor and the transistor of the current mirror circuit comprises an inter-layer insulating film laminated on the power amplifying bipolar transistor and on the bipolar transistor in the current mirror circuit, and a metallic wire which is laminated on the inter-layer insulating film so as to electrically connect an emitter electrode of the power amplifying bipolar transistor and emitter electrodes of the bipolar transistors in the current mirror circuit to a ground via through holes formed in the inter-layer insulating film at portions above each of the transistors.

Furthermore, in the semiconductor device according to the present invention, the metallic wire is made of a metallic layer of 2 $\mu$m or more in thickness.

Further, in the semiconductor device according to the present invention, a high-frequency amplification is carried out by a bipolar transistor circuit with a grounded emitter which is so biased to operate as a Class B or a Class AB amplifier and a DC base potential of the bipolar transistor with the grounded emitter is supplied by a current mirror circuit including one or more bipolar transistors.

These bipolar transistors are monolithically integrated on a common semiconductor substrate. A metallic layer for covering one or more transistors in the current mirror circuit is provided which is connected to an emitter electrode of the high-frequency amplifying transistor so as to reduce a difference between the junction temperatures of the high-frequency amplifying bipolar transistor and one or more bipolar transistors in the current mirror circuit.

Further, a semiconductor device according to the present invention comprises a multi-finger bipolar transistor having a plurality of element transistors forming fingers for high-frequency amplification. The bipolar transistor is so biased to operate as a Class B or a Class AB amplifier. The current mirror circuit including a bipolar transistor supplies a DC base potential for the bipolar transistor. These bipolar transistors are monolithically integrated on a common semiconductor chip. The bipolar transistor in the current mirror circuit is formed at an area on the substrate within a distance smaller than a thickness of the semiconductor chip from one of the plurality of the emitter fingers to reduce a difference between junction temperatures of the multi-finger transistor and the bipolar transistor in the current mirror circuit.

Further, a semiconductor device according to the present invention comprises a multi-finger bipolar transistor having a plurality of element transistors forming fingers for high-frequency amplification. The bipolar transistor is so biased to operate as a Class B or a Class AB amplifier. The current mirror circuit including a bipolar transistor supplies a DC base potential of the bipolar transistor. These bipolar transistors are monolithically integrated on a common semiconductor substrate. The bipolar transistor in the current mirror circuit is formed at an area between the emitter fingers to reduce a difference between junction temperatures of the multi-finger bipolar transistor and the bipolar transistor in the current mirror circuit.

Further, a semiconductor device according to the present invention comprises a multi-finger bipolar transistor having a plurality of element transistors forming fingers for high-frequency amplification. The bipolar transistor is so biased to operate as a Class B or a Class AB amplifier. The current mirror circuit including a bipolar transistor supplies a DC base potential for the bipolar transistor. These bipolar transistors are monolithically integrated on a common semiconductor substrate. The bipolar transistor in the current mirror circuit is formed at an area between the emitter fingers, and an emitter electrode of the multi-finger bipolar transistor and an emitter electrode of the bipolar transistors in the current mirror circuit are mutually connected with a metallic layer of 2 μm or more in thickness to reduce a difference between junction temperatures of the multi-finger bipolar transistor and the bipolar transistor in the current mirror circuit.

Further, in the semiconductor device according to the present invention, the current mirror circuit comprises a first and a second bipolar transistors each having an emitter electrode grounded and a base electrode connected to each other, a third bipolar transistor having an emitter electrode connected to a collector electrode of the second bipolar transistor and a base electrode connected to a collector electrode of the first bipolar transistor, and a bias power supply connected to the collector electrode of the first bipolar transistor via a load resistor. The collector electrode of the second bipolar transistor is connected to the base electrode of the second bipolar transistor and is also connected to a base electrode of the power amplifying bipolar transistor.

Further, in the semiconductor device according to the present invention, the current mirror circuit comprises a first bipolar transistor having a collector electrode connected to a bias power supply via a load resistor and a collector electrode connected to the base electrode, a second bipolar transistor having a collector electrode connected to an emitter electrode of the first bipolar transistor and to a base electrode of the second bipolar transistor, and an emitter electrode which is grounded, and a third bipolar transistor having a base electrode connected to the base electrode of the first bipolar transistor, an emitter electrode connected to a ground via a resistor, and a collector electrode connected to a bias power supply. The emitter electrode of the third bipolar transistor is connected to the base electrode of the bipolar transistor for carrying power amplification.

BRIEF DESCRIPTION OF THE DRAWINGS

FIG. 1 is a circuit diagram showing a Class B high-frequency power amplifier using a conventional HBT.

FIG. 2 is a graph showing a relationship between a collector output characteristic of the Class B amplifier shown in FIG. 1 and a load line.

FIG. 3 is a characteristic diagram for explaining the temperature characteristic of the HBT shown in FIG. 1.

DETAILED DESCRIPTION OF THE INVENTION

Figure 4:
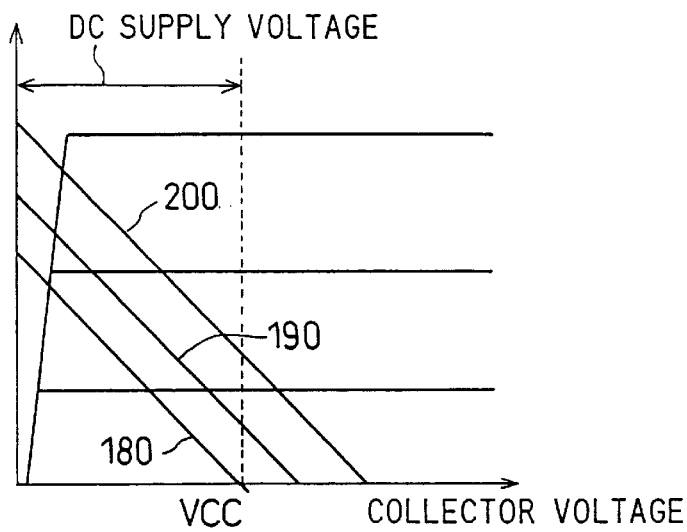
FIG. 4 is a characteristic diagram for explaining a relationship between a temperature of a transistor element of the Class B amplifier shown in FIG. 1 and load lines.
Figure 5:
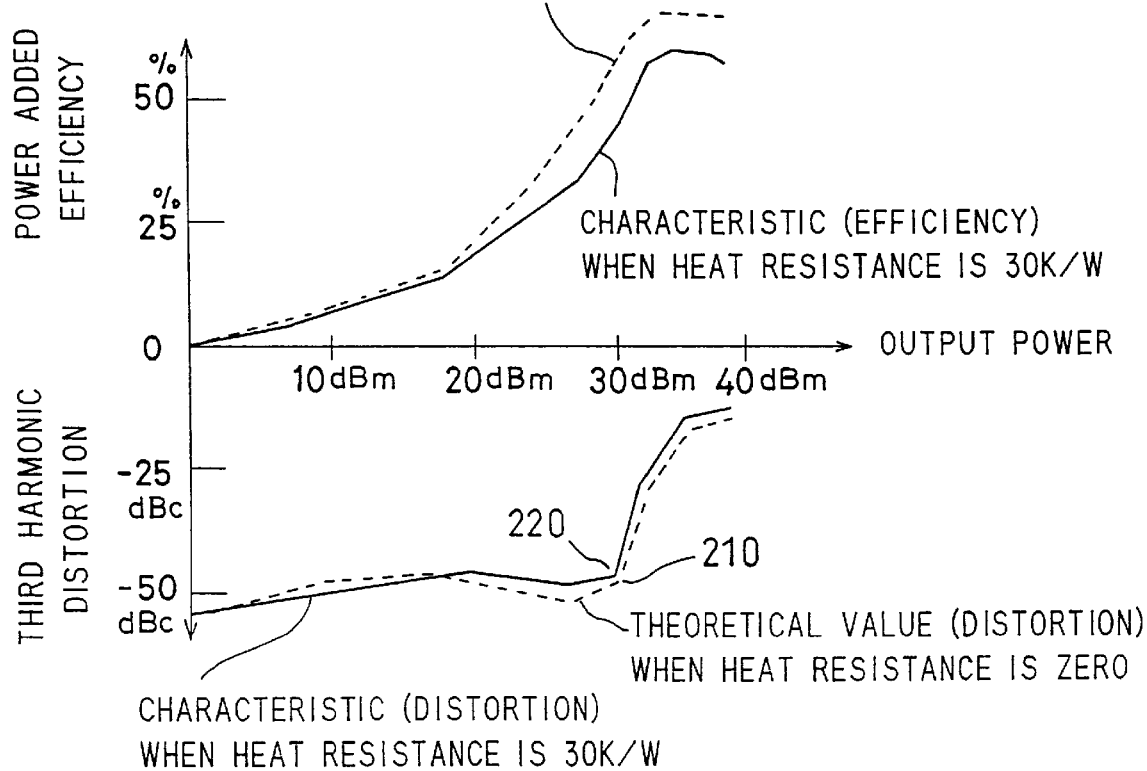
FIG. 5 is a drawing showing a relationship between power application efficiency for an output power of the Class B amplifier shown in FIG. 1 and a third harmonic distortion.
Figure 6:
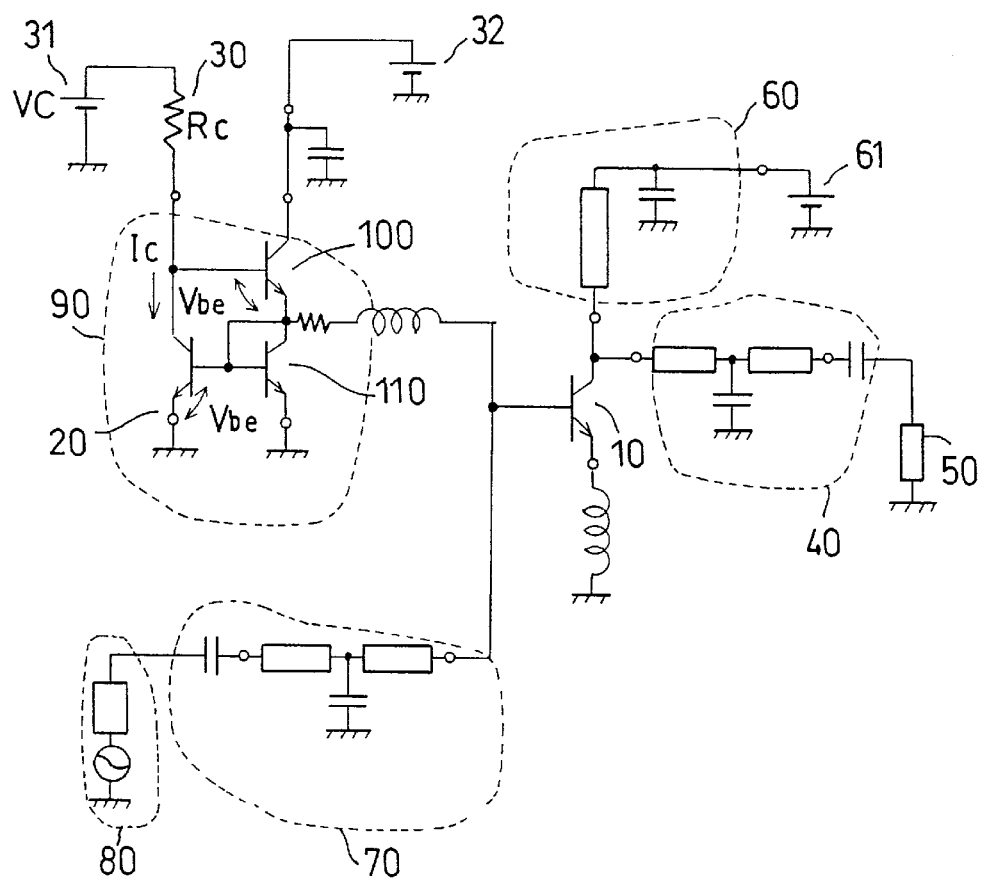
FIG. 6 is a circuit diagram showing a high-frequency power amplifier microwave monolithic IC (hereinafter referred to as MMIC) using an HBT to which the present invention is applied.

The embodiments of the present invention will be described in detail hereunder with reference to the accompanying drawings. FIG. 6 is a circuit diagram showing a semiconductor integrated circuit for high-frequency power amplification using a heterojunction bipolar transistor (hereinafter referred to as HBT) to which the present invention is applied.

A high-frequency power amplifying HBT (10) is formed with, for example, an InGaP-GaAs compound semiconductor and is a multi-finger transistor composed of, for example, 32 element transistors. To a base electrode of the HBT (10) a high-frequency input signal is supplied from an input signal source (80) via an input matching circuit (70) including a transmission line. From a collector electrode of the HBT 10, an amplified high-frequency input signal is taken out as an output signal via an output matching circuit (40) including a transmission line and supplied to an output load (50). The collector electrode of the HBT (10) is connected to a collector power supply (61) via a collector bias circuit (60) including a λ/4 transmission line.

A base voltage is supplied to the HBT (10) from a bias circuit composed of a current mirror circuit (90). The current mirror circuit (90) includes first and second HBTs (20) and (110) each having an emitter electrode grounded and a base electrode mutually connected. A collector electrode of the first HBT (20) is connected to a bias power supply (31) via a load resistor (30). A collector electrode of the second HBT (110) is connected to its own base electrode and is also connected to an emitter electrode of a third HBT (100). A base electrode of the third HBT (100) is connected to the collector electrode of the first HBT (20). A collector electrode of the third HBT (100) is connected to a bias power supply (32). Here, the second and third HBTs (110) and (100) form an emitter follower type buffer circuit for supplying a base current to the power amplifying HBT (10).

In the current mirror circuit (90) thus formed, the current Ic flowing from the collector electrode of the HBT (20) to the emitter electrode is given by the resistance Rc of the load resistor (30) and the voltage Vc of the bias power supply (31). Namely, assuming voltages between the base and emitter electrodes of the HBTs (20) and (100) as Vbe, the current is given by the following formula:

$$Ic=(Vc-2Vbe)/Rc$$

Here, although Vc and Rc are constant, Vbe varies with the temperature. Since a magnitude of variation is small and can be ignored against Vc, the current Ic is always kept constant even if the ambient temperature varies.

Suppose the current mirror circuit (90) supplies the base electrode of the high-frequency amplifying HBT (10) with a bias potential. If a size of the HBT (10) is N times as large as a size of the HBT (20) of the current mirror circuit (90), a DC collector current (idle current) of the power amplifying HBT (10) becomes N times as much as the current Ic flowing through the HBT (20). Since the HBT (10) is a transistor having 32 emitter fingers, as described above, the size of the HBT (10) is 32 times as large as the size of the HBT (20) and hence the current flowing in the HBT (10) is given to be 32 times as much as Ic.

This current is kept almost at a fixed value regardless of changes in the temperature as long as the HBT (10) is placed at the same temperature as that of the HBTs (20), (110), and (100) of the current mirror circuit (90).

Generally, the current mirror circuit is used to compensate for changes in the ambient temperature of ICs. Namely, when the ambient temperature changes and thus the temperature of each of the HBTs of the current mirror circuits changes, the current mirror circuit supplies an output voltage equivalent to the voltage which enables to flow a current equal to the control current Ic of the transistor. The current flowing through the transistors can be decided regardless of the ambient temperature.

The present invention uses the property of the current mirror circuit for temperature compensation for heat generation of a power transistor itself operating as a Class B or AB amplifier. In the power transistor operating as a Class B or a Class AB amplifier, the junction temperature changes dynamically according to the level of an input signal as described above. As a result, the current mirror circuit for compensating only static changes in the ambient temperature cannot compensate this dynamic temperature change. The present invention is characterized in that a thermal linkage is established between the HBT (10) used in the Class B or in the Class AB amplifying stage for carrying out power amplification and the HBT (20) of the current mirror circuit (90) for generating a bias voltage. The current mirror circuit (90) can thus correspond to dynamic changes in the temperature of the power amplifying HBT (10).

Figure 7:
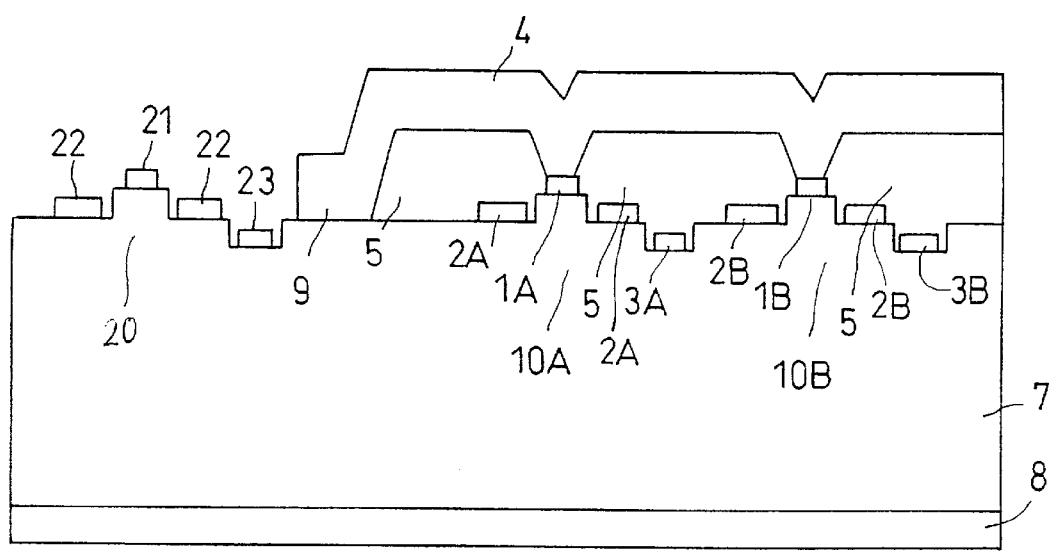
FIG. 7 is a cross sectional view showing an essential section of a MMIC, which is a first embodiment of the present invention.

FIG. 7 is a cross sectional view showing an essential part of an MMIC, which is a first embodiment of the present invention. Symbols (1A), (1B), - - - indicate emitter electrodes of a multi-finger power amplifying HBT (10). Symbols (2A), (2B), - - - indicate base electrodes of the HBT (10). Symbols (3A), (3B), - - - indicate collector electrodes of the HBT (10). Namely, the HBT (10) is composed of a plurality of element HBTs (10A), (10B), - - - arranged on a GaAs substrate (7). Here, the element HBT (10A) is a mesa-shaped transistor having the emitter electrode (1A), the base (2A), and the collector electrode (3A). The element HBT (10B) is also a mesa-shaped transistor having the emitter electrode (1B), the base electrode (2B), and the collector electrode (3B). The rest of the element HBTs have the same construction-as the element HBTs (10A) and (10B). In the following explanation, these element HBTs (10A), (10B), —are called as emitter fingers or merely fingers.

In the HBT (10) having such a structure, a gold-plate layer (4) having a thickness of 4 μm is formed as a wire for connecting the emitter electrodes (1A), (1B), —of the fingers to a ground. The gold-plated layer (4) is laminated on an insulating film (5) made of BCB (benzo cyclo butane) resin with through holes or contact holes and connected to the GaAs substrate (7) at a portion in the neighborhood of the HBT (20) of the current mirror circuit (90), which forms the ground. Since thermal conductivity of the BCB insulating film (5) is lower than that of GaAs, heat generated at junction of each emitter finger is transmitted to a grounding point (9) on the GaAs substrate (7) through the gold-plated layer (4). Although the thermal conductivity of the GaAs substrate is 0.4 W/K/cm, the thermal conductivity of gold is as high as 3 W/K/cm and hence the temperature difference between the emitter electrodes (1A, 1B, —) and the grounding point (9) is extremely small. Therefore, the temperature difference between the HBT (20) in the current mirror circuit (90) formed on the GaAs substrate (7) in the neighborhood of the grounding point (9) and the emitter electrodes (1A), (1B), —, of the power amplifying HBT (10) is remarkably reduced compared with a case where the gold-plated layer (4) is not provided.

Figure 8:
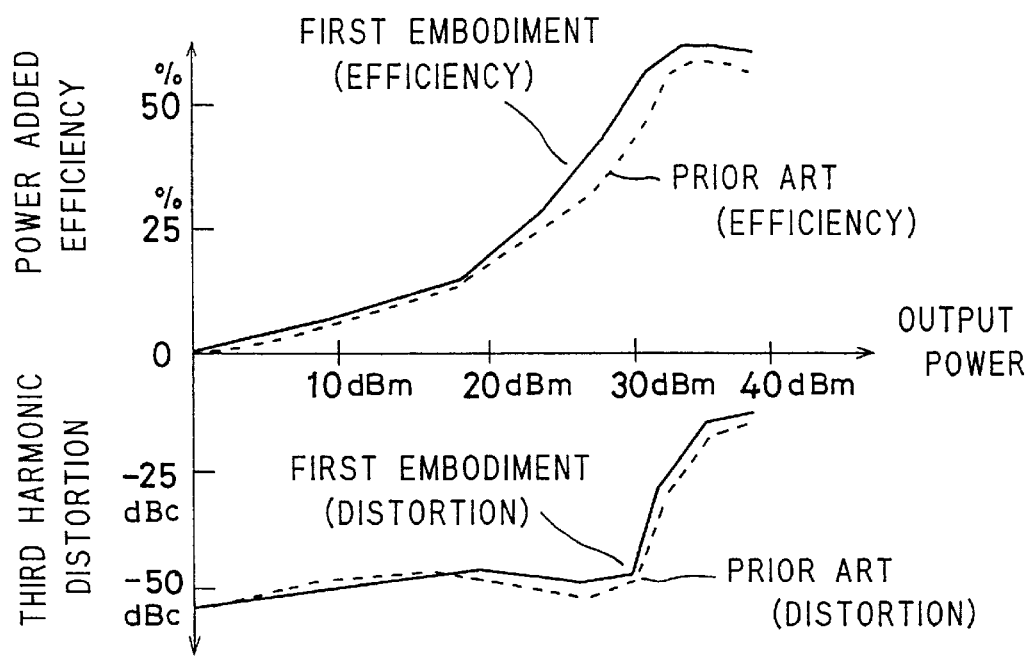
FIG. 8 is a drawing for comparatively showing a power efficiency of a power amplifier for a CDMA terminal to which the present invention is applied and a power efficiency of a power amplifier for a conventional CDMA terminal.

FIG. 8 comparatively shows a power efficiency of a power amplifier for a CDMA terminal to which the present invention is applied and a power efficiency of a conventional power amplifier for CDMA terminal. The pattern arrangements of the power amplifiers compared are exactly the same. In the embodiment of the present invention, the emitter electrodes of the multi-finger power amplifying HBT are plated with gold with a thickness of 4 μm, which is connected to the GaAs substrate at a point 10 μm away from the HBT (20) of the current mirror circuit. As a result, the maximum efficiency in the linear area is improved up to 52%, while it is 45% in a conventional example.

Figure 9:
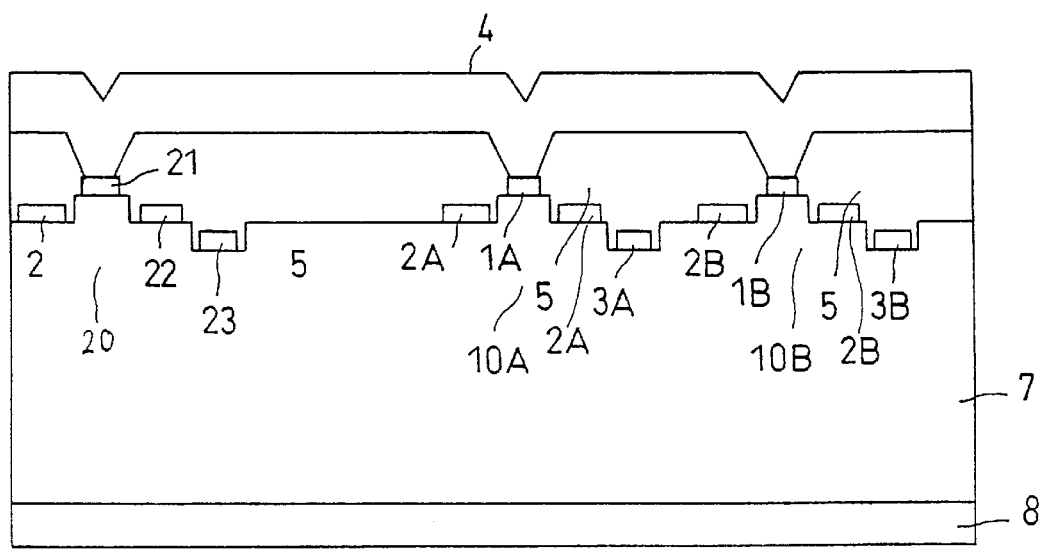
FIG. 9 is a cross sectional view showing an essential part of an MMIC, which is a second embodiment of the present invention.

FIG. 9 is a cross sectional view showing an essential part of an MMIC, which is a second embodiment of the present invention. In the embodiment, on emitter electrode (1A), (1B), —of each of the fingers of a multi-finger power amplifying HBT (10), the gold-plated layer (4) having a thickness of 4 μm is provided as a wire for grounding emitter electrodes. The gold-plated layer (4) is also directly connected to an emitter electrode (21) of the HBT (20) of the current mirror circuit. Since the gold-plated layer (4) has little thermal connection with other parts than the emitter electrodes (1A), (1B), —of the multi-finger power amplifying HBT (10), temperature of the gold-plated layer (4) becomes almost equal to the junction temperature at the emitter electrodes (1A), (1B), —of the HBT (10). Therefore, the junction temperature of the HBT (20) also becomes almost equal to the junction temperature of the HBT (10). Temperature compensation by the current mirror circuit is carried out efficiently for dynamic temperature changes of the HBT (10).

In FIG. 9, the same symbol is assigned to each of the corresponding parts to those shown in FIG. 7 and the detailed explanation is omitted.

Figure 10:
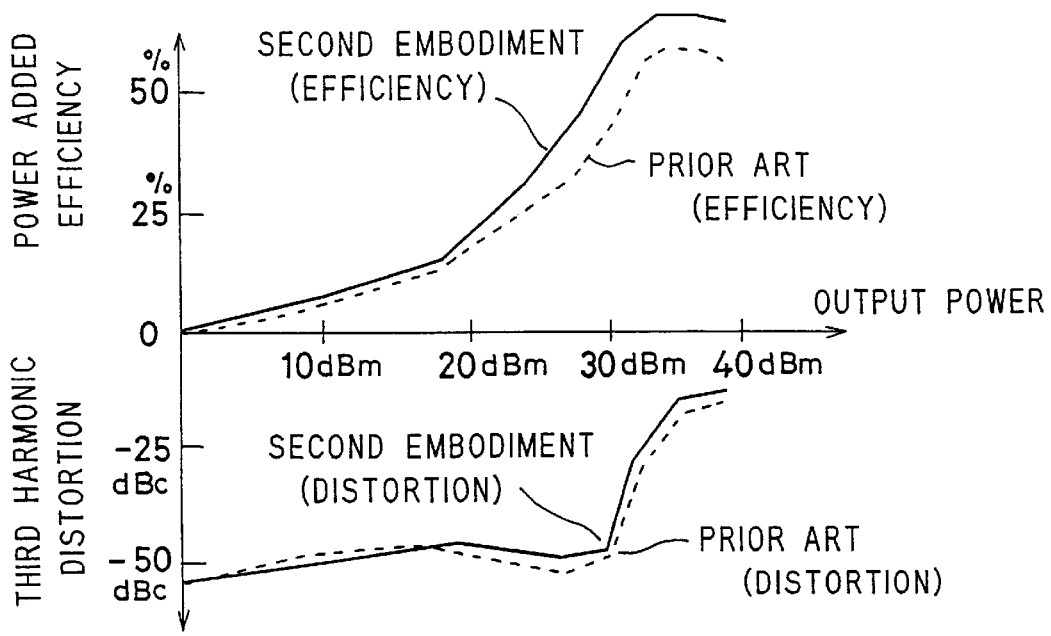
FIG. 10 is a drawing comparatively showing an efficiency of a power amplifier for a CDMA terminal to which the present invention is applied and an efficiency of a conventional power amplifier for a CDMA terminal.

FIG. 10 comparatively shows a power efficiency of a power amplifier for a CDMA terminal to which the present invention is applied and a power efficiency of a conventional power amplifier for CDMA terminal. The graphs indicated by the solid lines show the efficiency of the power amplifier of the present invention and the graphs indicated by the dashed lines shown in the drawing indicate the efficiency of a conventional power amplifier. The drawing shows that the maximum efficiency in the linear area of the power amplifier according to the present invention increased up to 56%, although conventional one is 45%. The maximum efficiency of the present invention is almost equivalent to the limit efficiency of 58%, which is obtained when there is no influence of a rise of the element temperature.

Figure 11:
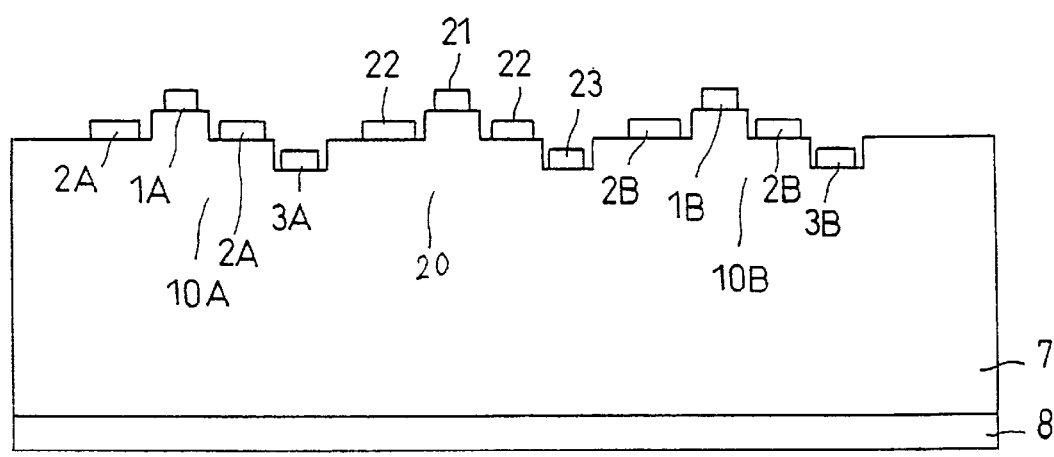
FIG. 11 is a cross sectional view showing an essential part of an MMIC, which is a third embodiment of the present invention.

FIG. 11 is a cross sectional view showing an essential part of an MMIC, which is a third embodiment of the present invention. In the embodiment, a HBT (20) of the current mirror circuit is located between fingers (10A) and (10B) of a multi-finger power amplifying HBT (10). With the arrangement, the thermal linking between the multi-finger HBT (10) and the HBT (20) of the current mirror circuit can be established.

In FIG. 11, the same numeral is assigned to each of the corresponding parts to those shown in FIG. 7 and the detailed explanation is omitted.

Figure 12:
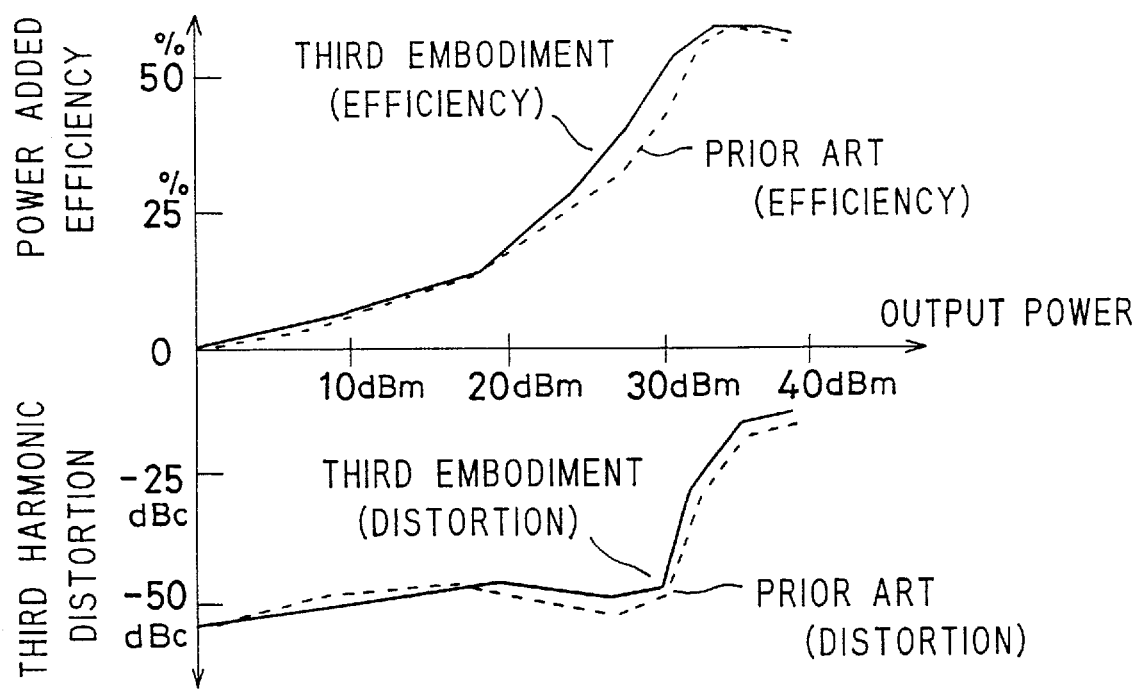
FIG. 12 is a drawing comparatively showing an efficiency of a power amplifier for a CDMA terminal to which the present invention is applied and an efficiency of a conventional power amplifier for a CDMA terminal.

The efficiency of the power amplifier for a CDMA terminal to which this embodiment is applied is shown in FIG. 12. In the same way as in FIG. 10, the graphs indicated by the solid lines show the efficiency of the power amplifier of the present invention and the graphs indicated by the dashed lines show the efficiency of a conventional power amplifier. The drawing shows that the maximum efficiency of the linear area of the present invention is increased up to 50%, while that of the conventional power amplifier is 45%.

Figure 13:
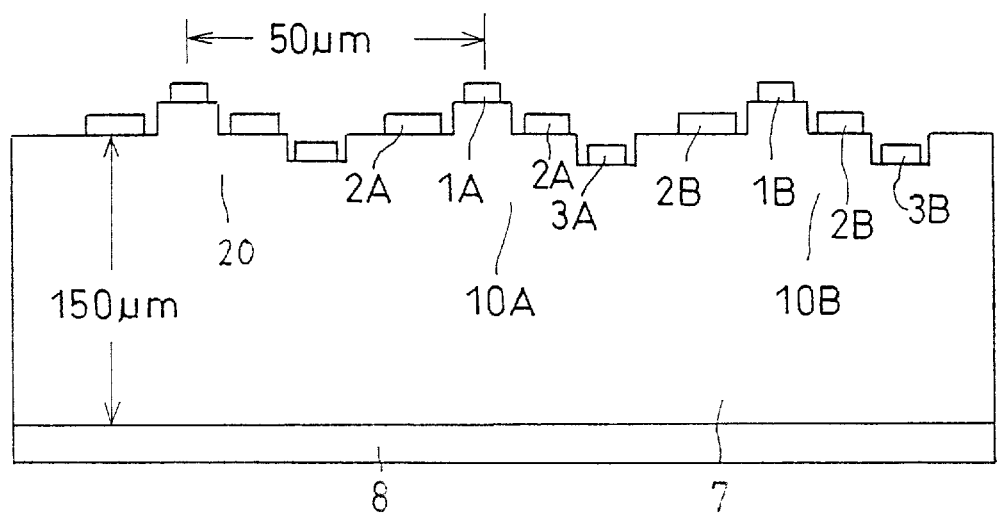
FIG. 13 is a cross sectional view showing an essential part of an MMIC, which is a fourth embodiment of the present invention.

FIG. 13 is a cross sectional view showing an essential part of an MMIC, which is a fourth embodiment of the present invention. In this embodiment, the distance between the HBT (20) of the current mirror circuit and an emitter electrode (1A) of a finger (10A) of a multi-finger power amplifying HBT is selected as such a small value, for example, as about 50 μm, with which the thermal linkage of the HBT (10) and the HBT (20) is established. Such an arrangement becomes effective when the distance between the HBT (10A) and the HBT (20) is reduced to the thickness of the semiconductor substrate (7) or less.

In FIG. 13, the same numeral is assigned to each of the corresponding parts to those shown in FIG. 7 and the detailed explanation is omitted.

Figure 14:
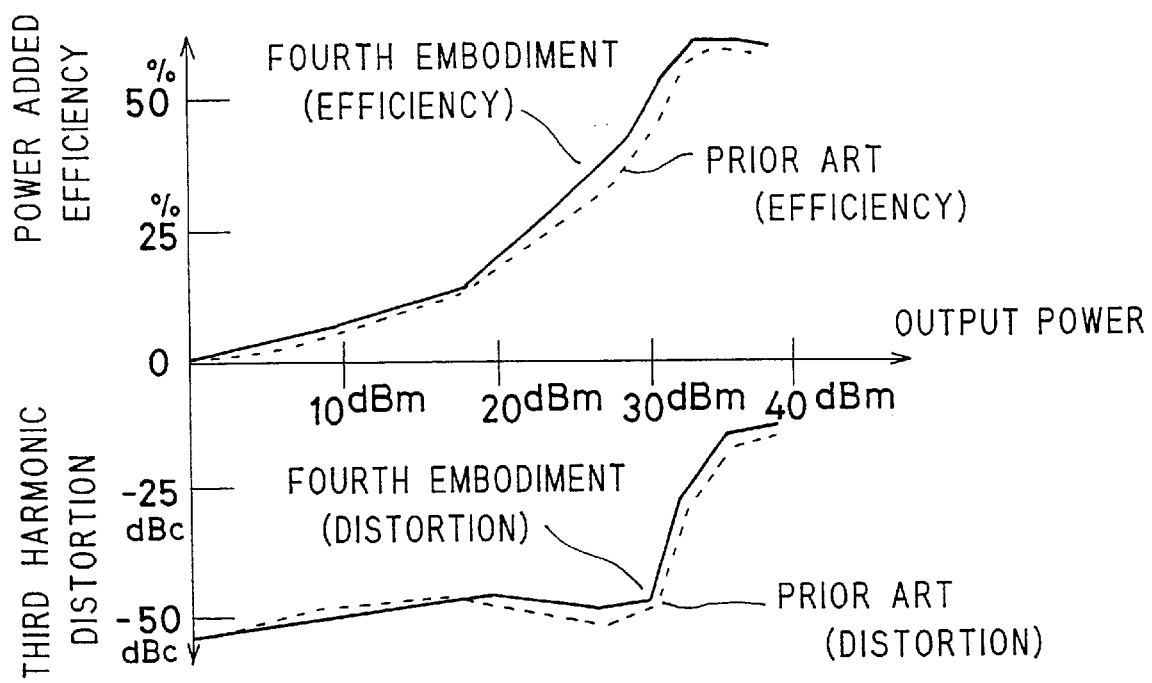
FIG. 14 is a drawing showing an efficiency of a power amplifier shown in FIG. 13.

The efficiency of the power amplifier for a CDMA terminal is shown in FIG. 14 when the thickness of the GaAs substrate (7) is selected as 150 μm and the distance between the finger (10A) of the HBT (10) and the HBT (20) of the current mirror circuit is selected as 50 μm. In the drawing, the dashed lines indicate the efficiency of the conventional semiconductor device in which the distance between the HBT (10A) and the HBT (20) is 400 μm. Although the maximum efficiency in the linear area of the conventional power amplifier is 45%, the efficiency of the present invention can be improved up to 49% when the distance is brought close to 50 μm.

Figure 15:
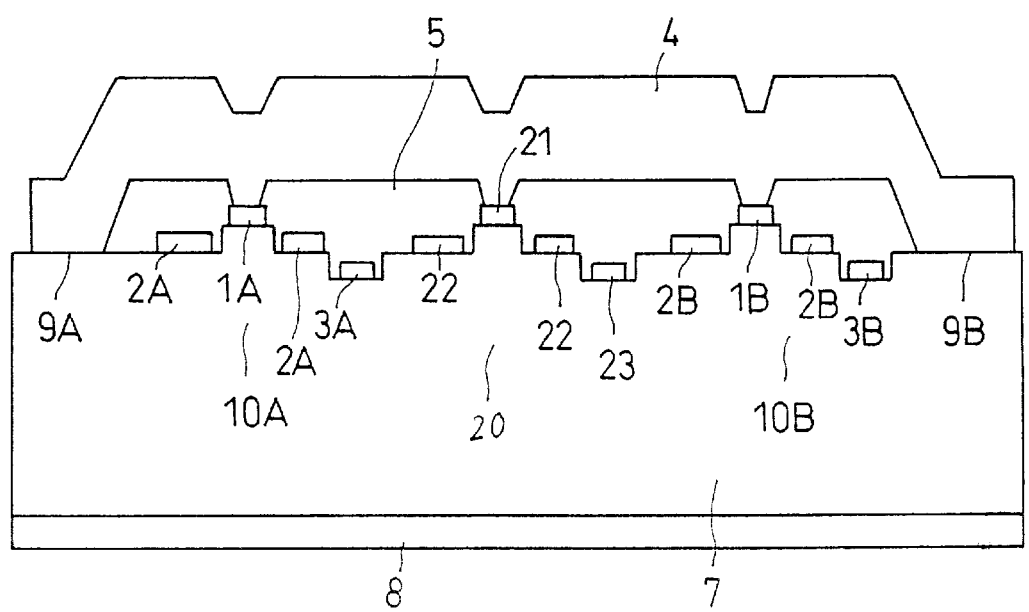
FIG. 15 is a cross sectional view showing an essential part of an MMIC, which is a fifth embodiment of the present invention.

FIG. 15 is a cross sectional view showing an essential part of an MMIC, which is a fifth embodiment of the present invention. In this embodiment, the HBT (20) of the current mirror circuit is located between the fingers (10A) and (10B) of multi-finger power amplification HBT (10). A gold-plated layer (4) having a thickness of 4 μm is provided on the emitter electrodes (1A), (1B), —of the power amplification HBT (10), as a wire for grounding. The wire is also directly connected to the emitter electrode (21) of the HBT (20) of the current mirror circuit.

The gold-plated layer (4) connects the emitter electrodes (1A), (1B), —of the fingers (10A), (10B), —of the multi-finger HBT (10) to the GaAs substrate (7) via heat conducting pads (9A) and (9B) each of which is positioned on the opposite side of the HBT (20) in the current mirror circuit. The heat generated by the emitter electrodes (1A), (1B), —of the fingers of the multi-finger HBT (10) is, therefore, transmitted to the GaAs substrate (7) through the gold-plated layer (4) and the heat conducting pads (9A) and (9B) thereby effectively reducing the heat resistance of the HBT (10).

Since the close thermal linkage between the HBT (20) of the current mirror circuit and the emitter electrodes (1A), (1B), —of the fingers (10A), (10B), —of the multi-finger power amplifying HBT (10) is established through the gold-plated layer (4), on the other hand, the junction temperature of the HBT (20) is almost equal to the junction temperature of the HBT (10) and, therefore, the compensation for dynamic temperature changes of the power amplification HBT (10) is efficiently carried out by the current mirror circuit.

In FIG. 15, the same numeral is assigned to each of the corresponding parts to those shown in FIG. 9 and the detailed explanation is omitted.

Figure 16:
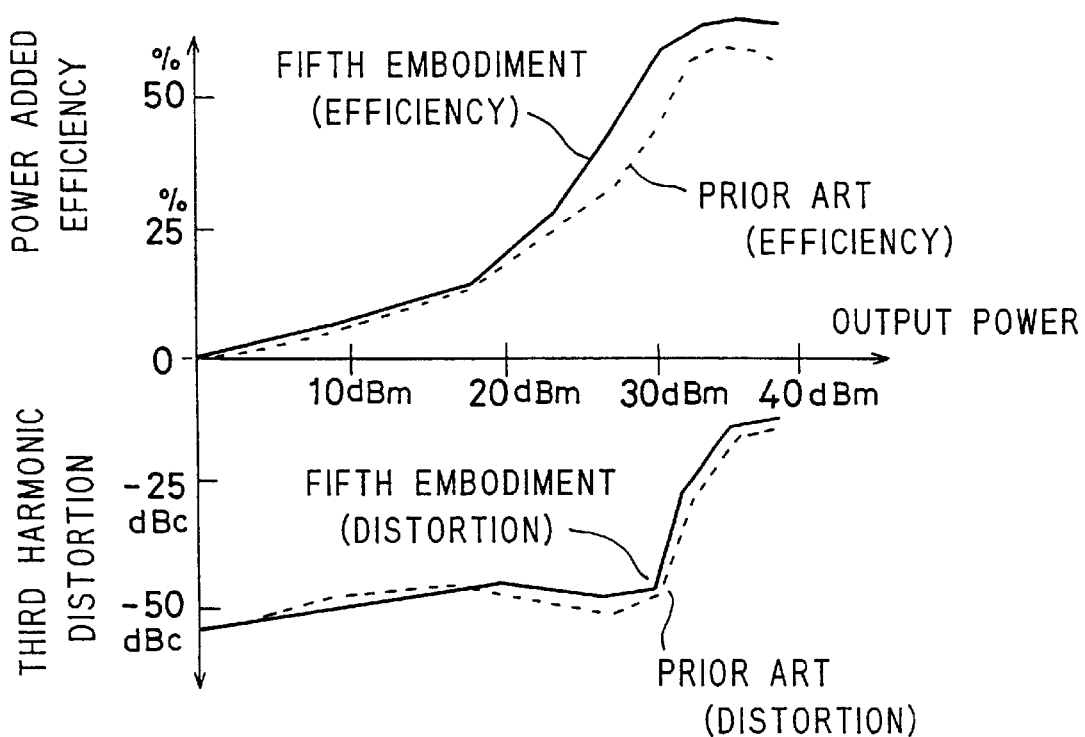
FIG. 16 is a drawing showing an efficiency of a power amplifier for a CDMA terminal shown in FIG. 19.

The efficiency of the power amplifier for a CDMA terminal to which the MMIC of this embodiment is applied is shown in FIG. 16. Although the maximum efficiency of the linear area of the conventional power amplifier is 45%, the efficiency of the power amplifier of the present invention can be improved up to 57%. Thus the influence of a rise of the element temperature is controlled, and the best property of a Class B linear amplifier can be realized.

Figure 17:
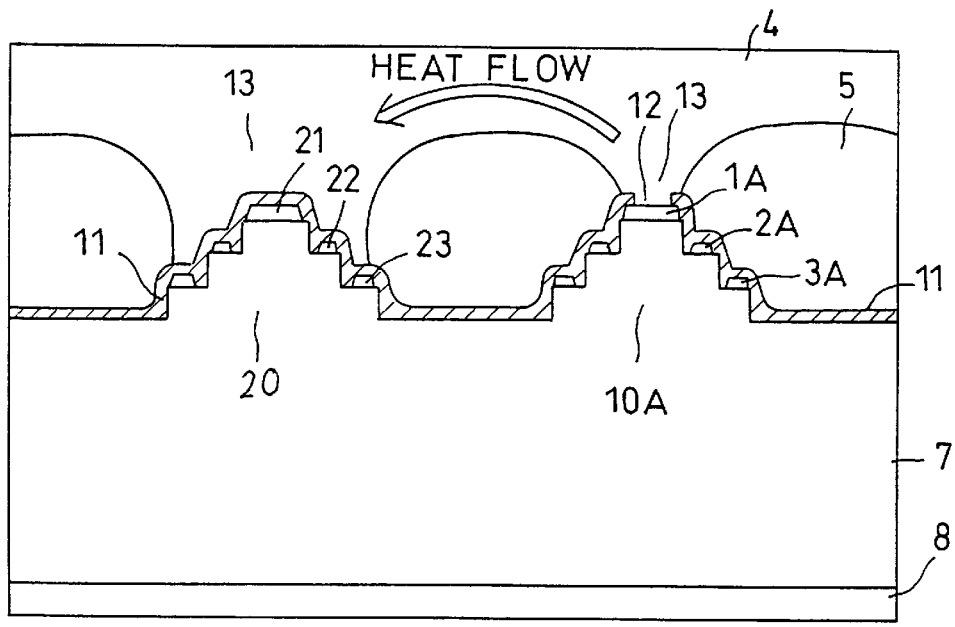
FIG. 17 is a cross sectional view showing an essential part of an MMIC, which is a sixth embodiment of the present invention.

FIG. 17 is a cross sectional view showing an essential part of an MMIC, which is a sixth embodiment of the present invention. In this embodiment, the HBT (20) of the current mirror circuit, which is a bias circuit, is arranged in the neighborhood of a finger (10A) of the multi-finger power amplifying HBT (10). Namely, on the GaAs semiconductor substrate (7), the mesa-shaped power amplifying HBT (10A) including the emitter electrode (1A), the base electrode (2A), and the collector electrode (3A) is formed. On the semiconductor substrate (7) in the neighborhood thereof, the mesa-shaped HBT (20) of the current mirror circuit including the emitter electrode (21), the base electrode (22), and the collector electrode (23) is formed. On the surface of the semiconductor substrate (7) including the HBT (10A) and HBT (20), a thin SiN insulating film (11) of 200 nm thick, which is a second insulating film, is formed. In the SiN insulating film (11), a contact hole (12) is formed at a portion above the emitter electrode (1A) of the HBT (10A). On the SiN insulating film (11), an insulating film (5) made of BCB resin is formed. In the insulating film (5), through holes (13) are formed at portion above the emitter electrode (1A) and at a portion where the HBT (20) is formed. On the insulating film (5) where the through holes (13) are thus formed, the gold-plated layer (4) having a thickness of 4 µm is formed all over the surface. Although not shown in figures, the gold-plated layer (4) is electrically connected to the emitter electrodes of the element HBTs that form the multi-finger HBT (10A) via contact holes (12) formed in the SiN insulating film (11).

The heat generated by the power amplifying HBT (10A) is transmitted to the HBT (20) via the thermally conductive gold-plated layer (4) and through the SiN insulating film (11). As a result, the temperature of the HBT (20) becomes almost equal to the temperature of the HBT (10A).

Figure 18:
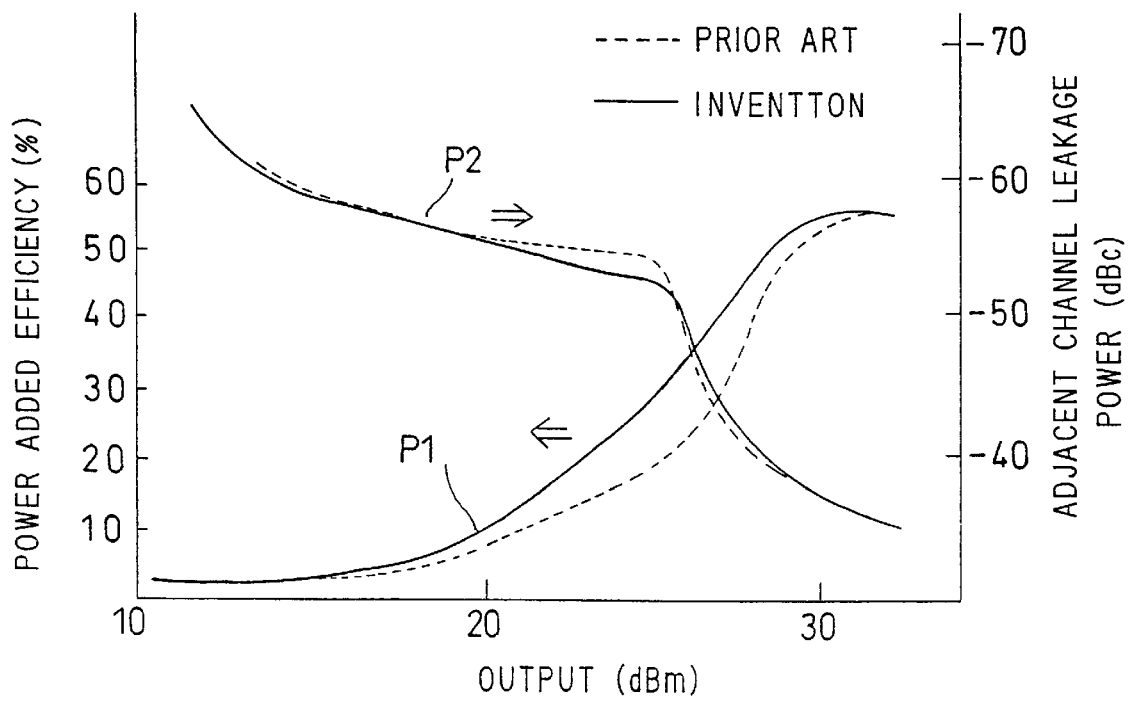
FIG. 18 is a characteristic curve comparatively showing a power added efficiency characteristic P1 and an adjacent channel leakage power P2 when the present invention is applied to a power amplifier for a CDMA terminal and those of a conventional power amplifier.

FIG. 18 is a characteristic curve comparatively showing, as an example, a power added efficiency characteristic P1 and the adjacent channel leakage power P2 of the power amplifier for a CDMA to which the present invention is applied with those of a conventional power amplifier. Among the characteristic curves P1 and P2, the curves of solid lines indicate the characteristics of the present invention and the curves of dashed lines indicate the conventional characteristics. The results show that in the efficiency of the power amplifier to which the present invention is applied is improved compared with that of the conventional amplifier in the linear area where the adjacent channel leakage power P2 is −50 dB or less.

Figure 19:
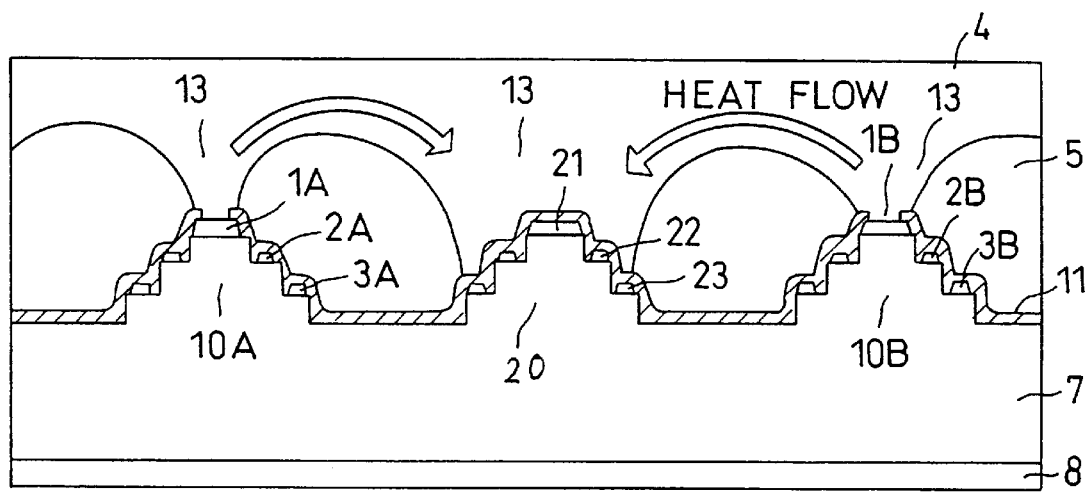
FIG. 19 is a cross sectional view showing an essential part of an MMIC, which is a seventh embodiment of the present invention.
Figure 20:
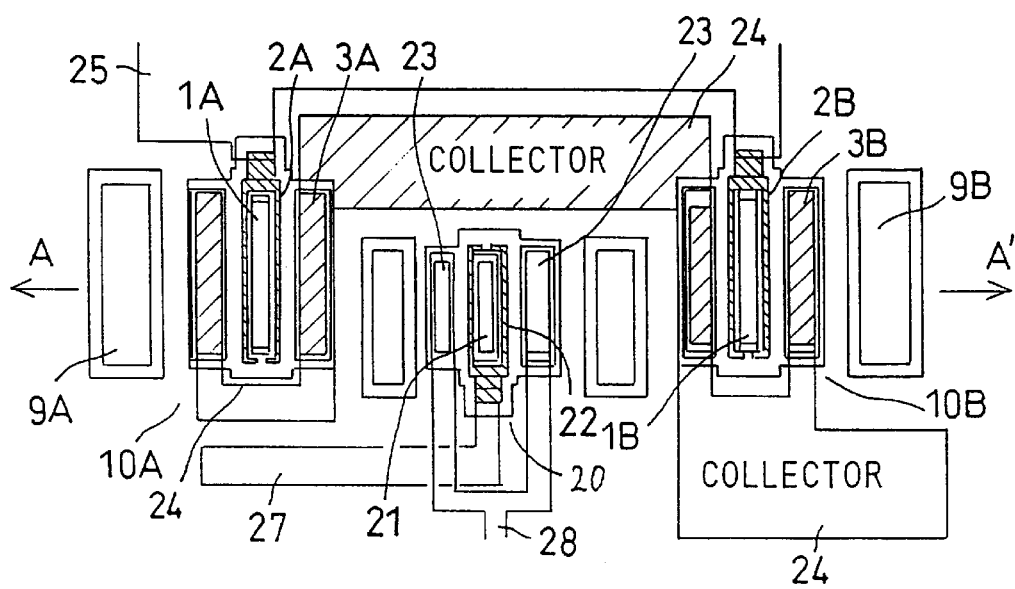
FIG. 20 is a plan view showing an essential part of the MMIC shown in FIG. 19.

FIG. 19 is a cross sectional view showing an essential part of an MMIC, which is a seventh embodiment of the present invention. FIG. 20 is a plan view showing the corresponding parts of the MMIC shown in FIG. 19. FIG. 19 is a cross sectional view along the arrow A—A' shown in FIG. 20. In this embodiment, the HBT (20) of the current mirror circuit is located between the fingers, the element HBT (10A) and (10B) forming the multi-finger power amplifying HBT (10). The gold-plated layer (4) having a thickness of 4 µm electrically connects the emitter electrodes (1A) and (1B) of the element HBTs (10A) and (10B) to each other and also covers the portion above the HBT (20). The other parts of the MMIC are formed almost in the same manner as those of the MMIC shown in FIG. 17, so that the same numeral is assigned to each of the same or corresponding parts and the detailed explanation is omitted.

In FIG. 20, a common collector electrode wire (24) to the element HBTs (10A) and (10B) and a base electrode wire (25) are provided respectively. Although not shown in FIG. 20, the gold-plated layer (4) which is an emitter electrode wire of the element HBTs (10A) and (10B) is provided to contact the heat conducting pads (9A) and (9B) provided on the semiconductor substrates (7) at the opposite sides of the element HBTs (10A) and (10B). For the base electrode (22) and the collector electrode (23) of the HBT (20) of the current mirror circuit, a base electrode wire (27) and a collector electrode wire (28) are provided on the semiconductor substrate (7) respectively.

With the arrangement described, the heat generated by the power amplifying element HBTs (10A) and (10B) is transmitted to the HBT (20) of the current mirror circuit from its both sides through the thermally conductive gold-plated layer (4). The temperature difference between both HBTs in this embodiment becomes smaller compared with that in the sixth embodiment.

Figure 21:
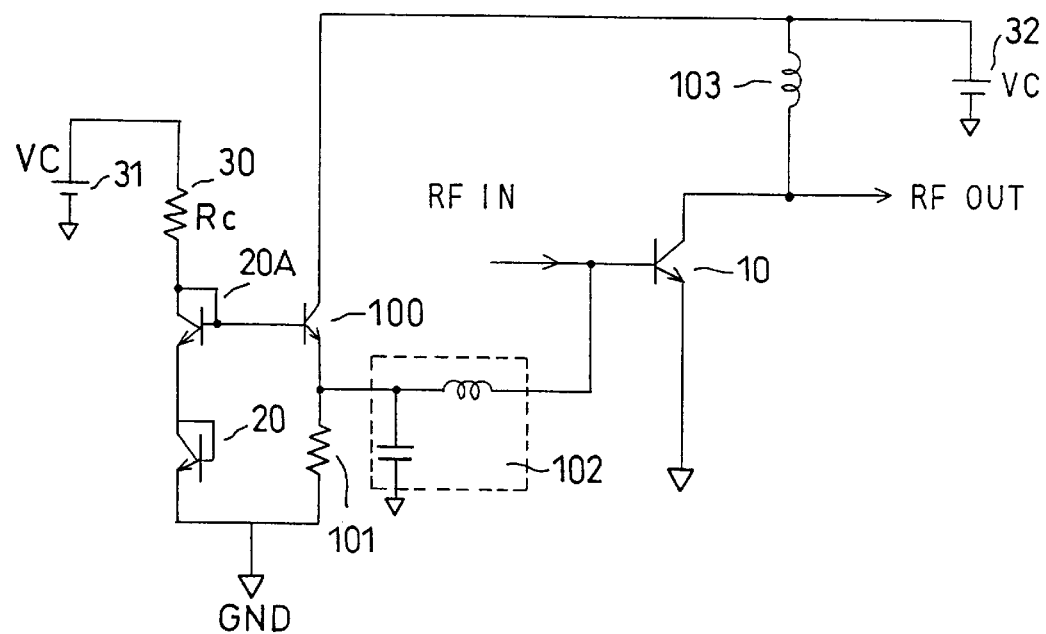
FIG. 21 is a circuit diagram showing another MMIC using an HBT for high-frequency power amplification to which the present invention is applied.

FIG. 21 is a circuit diagram showing a high-frequency power amplifier using an HBT to which the present invention is applied. This circuit is different in the current mirror circuit from the circuit shown in FIG. 6, and the other portions of the circuit are the same as those in FIG. 6. Namely, in the current mirror circuit shown in FIG. 21, a first and second HBTS (20) and (20A) of a diode connection for temperature compensation is connected in series with each other to the power supply (31) through a load resistor (30). A base electrode of a third HBT (100) is connected to a base electrode of the second HBT (20A) and a collector electrode of the HBT (100) is connected to another bias power supply (32). An emitter electrode of the first HBT (20) is grounded together with an emitter electrode of the third HBT (100) through a resistor (101). From the emitter electrode of the third HBT (100), an output bias voltage of the current mirror circuit is supplied to a base electrode of an amplifying HBT (10) via a low-pass filter (102). To a base electrode of the amplifying HBT (10), a high-frequency input signal RFIN is also supplied and an amplified high-frequency output signal is taken out from a collector electrode. The collector electrode of the amplifying HBT (10) is connected to the bias power supply (32) via an inductance (103).

In the circuit thus formed, the base voltage supplied to the base electrode of the amplifying HBT (10) is so controlled that an idle current flowing into the amplifying HBT (10) is always proportional to a current which is decided by the control voltage (31) and resistor (30) of the current mirror circuit.

Figure 22:
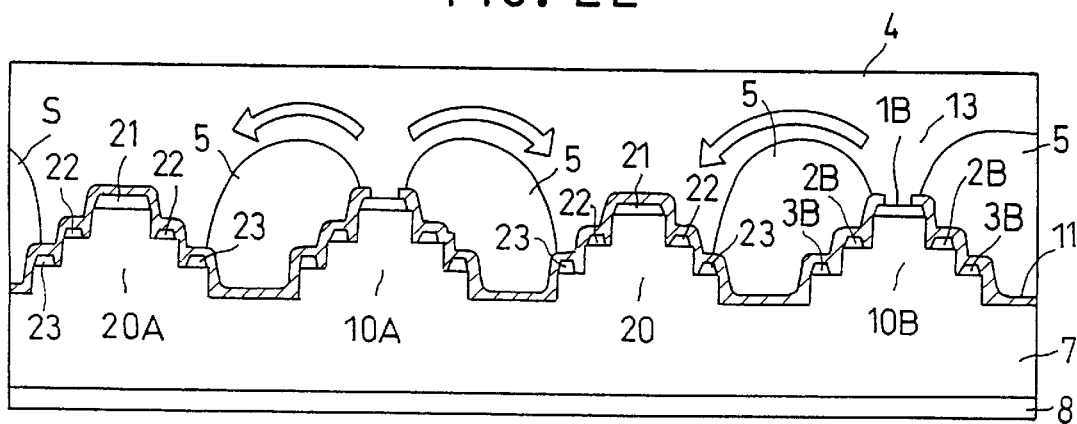
FIG. 22 is a cross sectional view showing an essential part of an MMIC, which is an eighth embodiment of the present invention.

FIG. 22 is a cross sectional view showing an essential part of an MMIC, which is an eighth embodiment of the present invention. In this embodiment, with respect to first and second HBTs (20) and (20A) for temperature compensation, the HBT (20A) is located in the neighborhood of a finger HBT (10A) of a multi-finger HBT (10). And the HBT (20) is located between a finger HBT (10A) and a finger HBT (10B) of the multi-finger HBT (10). The gold-plated layer (4) having a thickness of 4 µm electrically connects an emitter electrode (1A) of the finger HBT (10A) with an emitter electrode (1B) of the finger HBT (10B) and covers a portion above HBT (20) and (20A) of the current mirror circuit. The rest of the MMIC of the embodiment has almost the same configuration as that of the MMIC shown in FIG. 17 or 19, so that the same numeral is assigned to each of the same parts or corresponding parts to those in FIG. 17 or 19 and the detailed explanation is omitted.

By the MMIC thus formed, the heat generated by the finger HBTs (10A) and (10B) is transmitted to the HBTs (20) and (20A) of the current mirror circuit from both sides or one side through the thermally conductive gold-plated layer (4). The temperature difference between the power amplifying element HBTs (10A) or (10B) and the HBTs (20) or (20A) of the current mirror circuit is thus reduced.

In the figures drawn with respect to each embodiment, only two fingers of the multi-finger HBT are shown for simplicity. However, needless to say, the present invention may be applied to HBTS having fingers more than two.

In the embodiments described, the thickness of the gold-plated layer is 4 µm to realize a thermal linkage of the current mirror circuit and the power amplifying HBTs. However, an experiment of the inventors shows that a remarkable effect of the thermal linkage can be seen at a thickness of not less than 2 µm when a thermally conductive material such as gold or copper is used.

Furthermore, one or more of a plurality of HBTs (20), (110), and (100) included in the current mirror circuit may establish the thermal linkage with the power amplifying HBT.

What is claimed is:

1. A semiconductor device comprising a power amplifying bipolar transistor with an emitter grounded, a current mirror circuit including a bipolar transistor for supplying a base voltage to said power amplifying bipolar transistor, and a thermal linkage structure formed between a junction temperature of the power amplifying bipolar transistor and a junction temperature of the bipolar transistor included in the current mirror circuit;

wherein said thermal linkage structure comprises an inter-layer insulating film laminated on said power amplifying bipolar transistor and a metallic wire which is laminated on said inter-layer insulating film electrically connecting an emitter electrode of said power amplifying bipolar transistor to a ground via a through hole formed in said inter-layer insulating film, and which is extended to the neighborhood of said bipolar transistor included in said current mirror circuit.

2. A semiconductor device comprising a power amplifying bipolar transistor with an emitter grounded, a current mirror circuit including a bipolar transistor for supplying a base voltage to said power amplifying bipolar transistor, and a thermal linkage structure formed between a junction temperature of the power amplifying bipolar transistor and a junction temperature of the bipolar transistor included in the current mirror circuit;

wherein said thermal linkage structure comprises an inter-layer insulating film laminated on said power amplifying bipolar transistor and on said bipolar transistor included in said current mirror circuit and a metallic wire which is laminated on said inter-layer insulating film for electrically connecting an emitter electrode of said power amplifying bipolar transistor and an emitter electrode of said bipolar transistor included in said current mirror circuit to a ground via a through hole formed in said inter-layer insulating film at portions above each of said bipolar transistors.

3. A semiconductor device comprising a power amplifying bipolar transistor with an emitter grounded, a current mirror circuit including a bipolar transistor for supplying a base voltage to said power amplifying bipolar transistor, and a thermal linkage structure formed between a junction temperature of the power amplifying bipolar transistor and a junction temperature of the bipolar transistor included in the current mirror circuit;

wherein said thermal linkage structure comprises an inter-layer insulating film laminated on said power amplifying bipolar transistor and on said bipolar transistor included in said current mirror circuit and a metallic wire which is laminated on said inter-layer insulating film for electrically connecting an emitter electrode of said power amplifying bipolar transistor to a ground via a through hole formed in said inter-layer insulating film at a portion above said power amplifying bipolar transistor and which is electrically insulated from said emitter electrode of said bipolar transistor included in said current mirror circuit.

4. The semiconductor device according to claim 3, wherein said metallic wire is laminated on said bipolar transistor included in said current mirror circuit via another insulating film which is thinner than said inter-layer insulating film.

5. The semiconductor device according to claim 4, wherein said metallic wire is a metallic layer of 2 µm or more in thickness.

6. A semiconductor device comprising a power amplifying bipolar transistor with an emitter grounded, a current mirror circuit including a bipolar transistor for supplying a base voltage to said power amplifying bipolar transistor, and a thermal linkage structure formed between a junction temperature of the power amplifying bipolar transistor and a junction temperature of the bipolar transistor included in the current mirror circuit;

wherein said thermal linkage structure is an arrangement in which said bipolar transistor included in said current mirror circuit is located in the neighborhood of said power amplifying bipolar transistor; and wherein said power amplifying bipolar transistor with the emitter grounded comprises a mufti-finger transistor composed of a plurality of element transistors and said thermal linkage structure is an arrangement in which said bipolar transistor included in said current mirror circuit is located between fingers of said multi-finger bipolar transistor.

7. The semiconductor device according to claim 6, wherein said thermal linkage structure further comprises an inter-layer insulating film laminated on said power amplifying bipolar and on said bipolar transistor included in said current mirror circuit and a metallic wire which is laminated on said inter-layer insulating film for electrically connecting an emitter electrode of said power amplifying bipolar transistor and an emitter electrode of said bipolar transistor included in said current mirror circuit to a ground via a through hole formed in said inter-layer insulating film at portions above each of said bipolar transistors.

8. A semiconductor device according to claim 7, wherein said metallic wire comprises a metallic layer of 2 µm or more in thickness.

9. A semiconductor device comprising a high-frequency amplifying bipolar transistor with an emitter grounded and a current mirror circuit including a bipolar transistor for supplying said high-frequency amplifying bipolar transistor with a DC base potential with which said high-frequency amplifying bipolar transistor operates as a Class B or a Class AB amplifier, said high-frequency amplifying bipolar transistor and said bipolar transistor included in said current mirror circuit being monolithically integrated on a common semiconductor substrate, and a metallic layer provided for covering the transistor in the current mirror circuit and connected to an emitter electrode of the high-frequency amplifying transistor so as to reduce a difference between junction temperatures of the high-frequency amplifying bipolar transistor and of the bipolar transistor in the current mirror circuit.

10. A semiconductor device comprising a multi-finger bipolar transistor having a plurality of element transistors forming plurality of fingers for high-frequency amplification and a current mirror circuit including a bipolar transistor for supplying said multi-finger bipolar transistor with a DC base potential with which said multi-finger bipolar transistor operates as a Class B or a Class AB amplifier, wherein said multi-finger bipolar transistor and said bipolar transistor included in said current mirror circuit are monolithically integrated on a common semiconductor chip, and said bipolar transistor included in said current mirror circuit is formed at an area on said semiconductor chip within a distance smaller than a thickness of said semiconductor chip from one of said plurality of fingers to reduce a difference between junction temperatures of said multi-finger bipolar transistor and said bipolar transistor included in said current mirror circuit.

11. A semiconductor device comprising a multi-finger bipolar transistor having a plurality of element transistors forming plurality of fingers for high-frequency amplification and a current mirror circuit including a bipolar transistor for supplying said multi-finger bipolar transistor with a DC base potential with which said multi-finger bipolar transistor operates as a Class B or a Class AB amplifier, wherein said multi-finger bipolar transistor and said bipolar transistor included in said current mirror circuit are monolithically integrated on a common semiconductor substrate, and said bipolar transistor in the current mirror circuit is formed at an area between said fingers to reduce a difference between junction temperatures of said multi-finger bipolar transistor and said bipolar transistor in the current mirror circuit.

12. A semiconductor device comprising a multi-finger bipolar transistor having a plurality of element transistors forming plurality of fingers for high-frequency amplification and a current mirror circuit including a bipolar transistor for supplying said multi-finger bipolar transistor with a DC base potential with which said multi-finger bipolar transistor operates as a Class B or a Class AB amplifier, said multi-finger bipolar transistor and said bipolar transistor included in said current mirror circuit being monolithically integrated on a common semiconductor substrate and a metallic layer of 2 $\mu$m or more in thickness connecting an emitter electrode of said multi-finger bipolar transistor to an emitter electrode of said bipolar transistors in the current mirror circuit, so as to reduce a difference between junction temperatures of the multi-finger bipolar transistor and the bipolar transistor in the current mirror circuit, wherein said bipolar transistor in the current mirror circuit is formed at an area between said fingers to reduce a difference between junction temperatures of said multi-finger bipolar transistor and said bipolar transistor in the current mirror circuit.

13. A semiconductor device comprising a power amplifying bipolar transistor with an emitter grounded, a current mirror circuit including a bipolar transistor for supplying a base voltage to said power amplifying bipolar transistor, and a thermal linkage structure formed between a junction temperature of the power amplifying bipolar transistor and a junction temperature of the bipolar transistor included in the current mirror circuit;

wherein said current mirror circuit comprises first and second bipolar transistors each having an emitter electrode grounded and a base electrode connected to each other, a third bipolar transistor having an emitter electrode connected to a collector electrode of said second bipolar transistor and a base electrode connected to a collector electrode of said first bipolar transistor, and a bias power supply connected to said collector electrode of said first bipolar transistor via a load resistor, said collector electrode of said second bipolar transistor being connected to the base electrode of said second bipolar transistor and being also connected to a base electrode of said power amplifying bipolar transistor.

14. A semiconductor device comprising a power amplifying bipolar transistor with an emitter grounded, a current mirror circuit including a bipolar transistor for supplying a base voltage to said power amplifying bipolar transistor, and a thermal linkage structure formed between a junction temperature of the power amplifying bipolar transistor and a junction temperature of the bipolar transistor included in the current mirror circuit;

wherein said current mirror circuit comprises a first bipolar transistor having a collector electrode connected to a bias power supply via a load resistor and to a base electrode thereof, a second bipolar transistor having a collector electrode connected to an emitter electrode of said first bipolar transistor and to a base electrode of the second bipolar transistor and an emitter electrode which is grounded, and a third bipolar transistor having a base electrode connected to said base electrode of the first bipolar transistor, an emitter electrode connected to a ground via a resistor and a collector electrode connected to a bias power supply, said emitter electrode of said third bipolar transistor being connected to a base electrode of said power amplifying bipolar transistor.

* * * * *